(12) United States Patent
Prasad et al.

(10) Patent No.: US 7,194,710 B2
(45) Date of Patent: Mar. 20, 2007

(54) SCHEDULING EVENTS IN A BOOLEAN SATISFIABILITY (SAT) SOLVER

(75) Inventors: Mukul R. Prasad, Sunnyvale, CA (US); Rajarshi Mukherjee, San Jose, CA (US)

(73) Assignee: Fujitsu Limited, Kawasaki (JP)

( * ) Notice: Subject to any disclaimer, the term of this patent is extended or adjusted under 35 U.S.C. 154(b) by 192 days.

(21) Appl. No.: 10/807,959

(22) Filed: Mar. 23, 2004

(65) Prior Publication Data

US 2005/0216871 A1   Sep. 29, 2005

(51) Int. Cl.
  *G06F 17/50* (2006.01)
(52) U.S. Cl. .............................. 716/4; 716/5
(58) Field of Classification Search .................... 716/4, 716/3, 5, 7; 703/2; 706/19
  See application file for complete search history.

(56) References Cited

U.S. PATENT DOCUMENTS

| | | | | |
|---|---|---|---|---|
| 6,556,978 | B1 * | 4/2003 | Ginsberg et al. | 706/19 |
| 6,651,234 | B2 * | 11/2003 | Gupta et al. | 716/7 |
| 6,912,700 | B1 * | 6/2005 | Franco et al. | 716/5 |
| 2003/0084411 | A1 * | 5/2003 | Moskewicz et al. | 716/3 |
| 2003/0225552 | A1 * | 12/2003 | Ganai et al. | 703/2 |

OTHER PUBLICATIONS

"Chaff: Engineering an Efficienct SAT Solver", Proc. of the 38th Design Automation Conference, Jun. 2001, Moskewicz et al.*
"The Quest for Efficeint Boolean Satisfiability Solvers", Princeton University, 2002, Zhang et al.*
"GRASP: A Search Algorithm for Porpositional Satisfiability", IEEE Trans. on Computers, vol. 48, No. 5, May 1999, Marques-Silva et al.*

Marques-Silva et al., "GRASP: A Search Algorithm for Propositional Satisfiability," IEEE Trans. on Computers, vol. 48, No. 5, pp. 506-521, May 1999.
Moskewicz et al., "Chaff: Engineering and Efficient SAT Solver," in Proc. of the 38th Design Automation Conference, Jun. 2001, pp. 530-535.
Zhang et al., "SATO: An Efficient Propositional Prover," in Proc. of the International Conference on Automated Deduction, Jul. 1997, pp. 272-275.
Goldberg et al., "BerkMin: a Fast and Robust Sat-Solver," in Proc. of Design and Test in Europe, Mar. 2002, pp. 142-149.
Stephen et al., "Combinational Test Generation Using Satisfiability," IEEE Trans. in CAD, vol. 15, No. 9, pp. 1167-1176, Sep. 1996.
Biere et al., "Symbolic Model Checking without BDDs," in Proc. of TACAS'99, Mar. 1999, pp. 193-207.
Bryant, et al., "Processor Verification Using Efficient Reductions of the Logic of Uninterpreted Functions to Propositional Logic," ACM Trans. on Computational and Sequential Logic, vol. 2. No. 1, pp. 1-41, Jan. 2001.
Entrena et al., "Combinational and Sequential Logic Optimization by Redundancy Addition and Removal," IEEE Trans. on CAD, vol. 14, No. 7, pp. 909-916, Jul. 1995.
Wood et al., "FPGA Routing and Routability Estimation via Boolean Satisfiability," IEEE Trans. on VLSI, vol. 6, No. 2, pp. 222-231, Jun. 1998.
Davis et al., "A Machine Program for Theorem-Proving," Communications of the ACM, vol. 5, pp. 394-397, Jul. 1962.

* cited by examiner

*Primary Examiner*—Sun James Lin
(74) *Attorney, Agent, or Firm*—Baker Botts L.L.P.

(57) ABSTRACT

In one embodiment, a method for scheduling events in a Boolean satisfiability (SAT) solver includes collecting one or more first-order statistics on a search for a valid solution to an SAT problem, deriving one or more second-order statistics on the search from the one or more first-order statistics, and scheduling events in the search according to one or more of the second-order statistics.

22 Claims, 2 Drawing Sheets

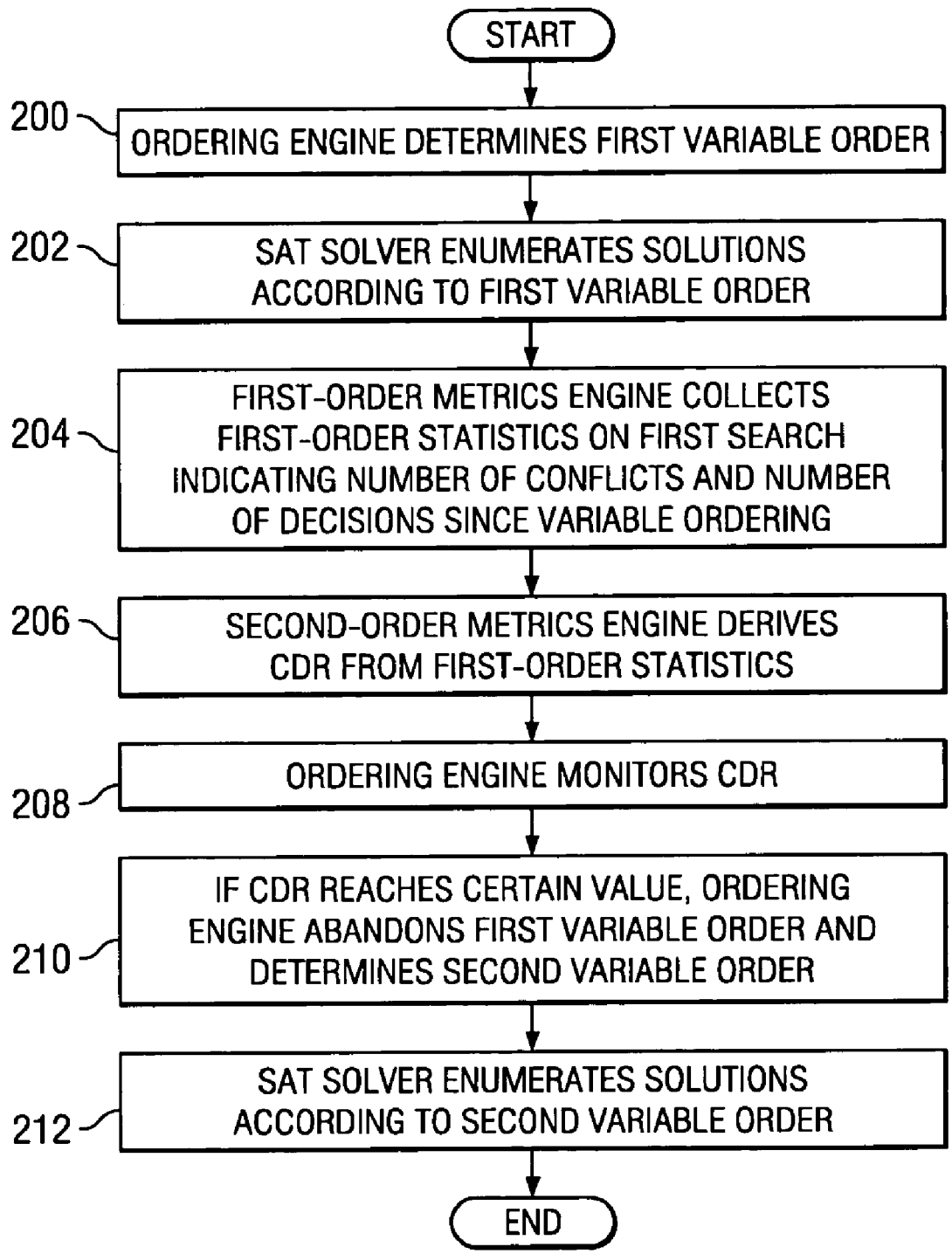

SCHEDULING EVENTS IN A BOOLEAN SATISFIABILITY (SAT) SOLVER

TECHNICAL FIELD OF THE INVENTION

This invention relates generally to SAT solvers and more particularly to scheduling events in an SAT solver.

BACKGROUND

SAT solvers typically have multiple applications. For example, SAT solvers are often used in electronic design automation (EDA) applications, such as automatic test pattern generation (ATPG), formal verification, logic optimization, physical design, and other EDA applications. SAT solvers typically use backtracking algorithms that are based on a Davis-Putman-Logeman-Loveland (DPLL) procedure with nonchronological backtracking and conflict-based learning. In addition, SAT solvers typically use techniques such as Boolean Constraint Propagation (BCP), dynamic restarting, dynamic variable ordering, and efficient management of clause databases.

SUMMARY OF THE INVENTION

According to the present invention, disadvantages and problems associated with search organization in an SAT sovler may be reduced or eliminated.

In one embodiment, a method for scheduling events in a Boolean satisfiability (SAT) solver includes collecting one or more first-order statistics on a search for a valid solution to an SAT problem, deriving one or more second-order statistics on the search from the one or more first-order statistics, and scheduling events in the search according to one or more of the second-order statistics.

Particular embodiments of the present invention may provide one or more technical advantages. Particular embodiments may reduce time requirements associated with searching for a valid solution to an SAT problem. Particular embodiments may reduce processing requirements associated with searching for a valid solution to an SAT problem. Particular embodiments may provide one or more metrics for more accurately evaluating efficiency of a particular variable ordering for enumerating solutions to an SAT problem in a search for a valid solution to the SAT problem. Particular embodiments may provide one or more metrics for more accurately evaluating efficiency of a particular search tree for searching for a valid solution to an SAT problem. Particular embodiments may provide better scheduling of events (such as restarts and variable reorderings) in an SAT solver to increase efficiency of an search for a valid solution to an SAT problem.

Certain embodiments may provide all, some, or none of these technical advantages. Certain embodiments may provide one or more other technical advantages, one or more of which may be readily apparent to those skilled in the art from the figures, descriptions, and claims herein.

BRIEF DESCRIPTION OF THE DRAWINGS

To provide a more complete understanding of the present invention and the features and advantages thereof, reference is made to the following description, taken in conjunction with the accompanying drawings, in which:

FIG. 3 illustrates another example method for scheduling events in an SAT solver.

DESCRIPTION OF EXAMPLE EMBODIMENTS

Figure 1:
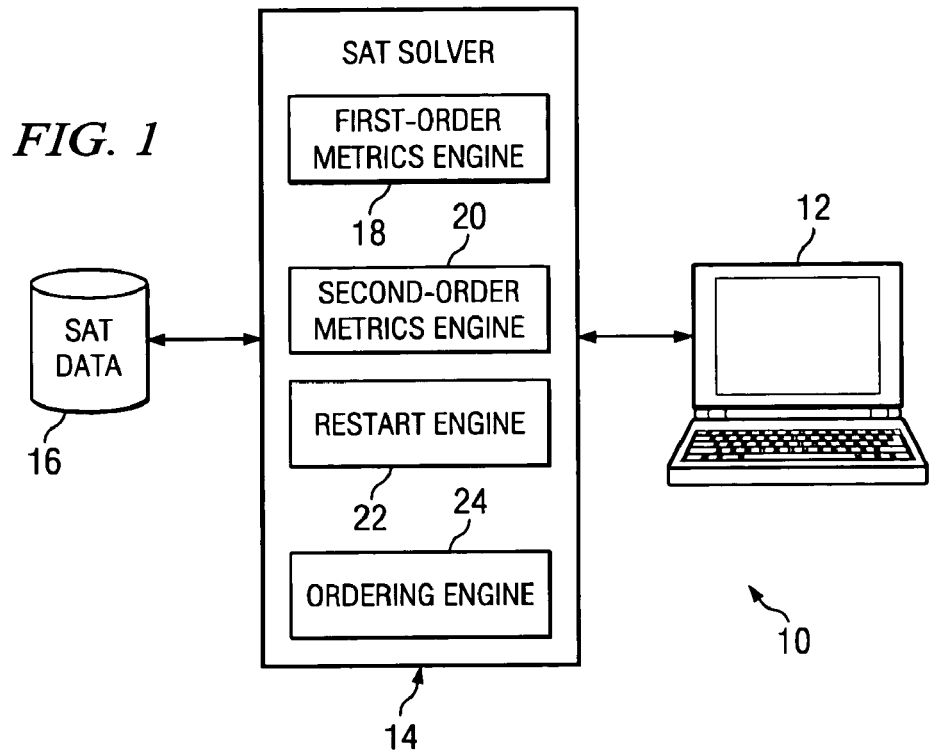
FIG. 1 illustrates an example system for scheduling events in an SAT solver

FIG. 1 illustrates an example system 10 for scheduling events in an SAT solver. System 10 includes a computer system 12, an SAT solver 14, and SAT data 16. Computer system 12 may enable a user to provide input to and receive output from SAT solver 14. As described below, SAT solver 14 may search for a valid solution to an SAT problem. SAT solver 14 may use SAT data 16 to search for the valid solution. An SAT problem may logically represent one or more problems in a real domain. A valid solution to an SAT problem satisfies all clauses (or constraints) of the SAT problem, and an invalid solution to the SAT problem violates one or more of the clauses of the SAT problem. SAT solver 14 may include hardware, software, or both for searching for a valid solution to an SAT problem. Although computer system 12, SAT solver 14, and SAT data 16 are illustrated and described as being more or less separate from each other, the present invention also contemplates two or more of computer system 12, SAT solver 14, and SAT data 16 being more or less combined with each other. As an example and not by way of limitation, in particular embodiments, SAT solver 14 may be a software component of computer system 12 and SAT data 16 may be stored at computer system 12.

SAT solver 14 includes a first-order metrics engine 18, a second-order metrics engine 20, a restart engine 22, and an ordering engine 24. An engine may include hardware, software, or both for performing one or more particular tasks associated with searching for a valid solution to an SAT problem. Although the components of SAT solver 14 are described and illustrated as being more or less separate from each other, the present invention also contemplates any suitable components of SAT solver 14 being more or less combined with each other. To search for a valid solution to an SAT problem, SAT solver 14 may enumerate possible solutions to the SAT problem and determine whether the solutions are valid. SAT solver 14 may use any suitable technique to determine whether a solution is valid. One or more of these techniques may be well known in the prior art. In particular embodiments, SAT solver 14 enumerates solutions more or less heuristically. In particular embodiments, SAT solver 14 may enumerate solutions to the SAT problem until SAT solver 14 either enumerates a valid solution or enumerates all possible solutions. To enumerate a solution to an SAT problem, SAT solver 14 may assign a value to each of one or more variables of the SAT problem. SAT solver 14 may enumerate solutions to an SAT problem according to a branch and bound technique, as described below. In addition, as SAT solver 14 executes a branch and bound technique, SAT solver 14 may use a conflict determination technique and a conflict analysis technique, as further described below.

According to a branch and bound technique, SAT solver 14 may determine a particular variable order and start to enumerate a solution to the SAT problem according to that particular variable order. Before SAT solver 14 has finished enumerating the solution, SAT solver 14 may determine, according to one or more particular criteria, whether to stop enumerating and abandon the solution. If SAT solver 14 abandons the solution, SAT solver 14 may abandon all solutions that include the enumerated portion of the solution.

Because all solutions that include the partially enumerated solution also necessarily violate at least the same clauses as the partially enumerated solution, SAT solver 14 may do so without individually enumerating each such solution and determining whether the solution satisfies all the clauses of the SAT problem, which may reduce one or more time or other requirements associated with searching for a valid solution to the SAT problem.

SAT solver 14 may use a conflict determination technique to determine whether to abandon a solution. Reference to a conflict may encompass one or more violations of one or more clauses of an SAT problem. According to such a technique, SAT solver 14 may start to enumerate a particular solution and, if SAT solver 14 identifies a conflict between the particular solution and the clauses of the SAT problem before SAT solver 14 finishes enumerating the particular solution, stop enumerating and abandon the particular solution and all solutions that include the enumerated portion of the particular solution. As an example and not by way of limitation, consider an SAT problem with variables A through J. SAT solver 14 may determine a particular variable order and start to assign values to the ten variables of the SAT problem according to that particular variable order. The particular variable order may be variable J, then variable C, then variable A, then variable B, then variable D, then variable E, then variable I, then variable F, then variable H, and then variable G. SAT solver 14 may accordingly assign a value to variable J, then assign a value to variable C, then assign a value to a variable A, then assign a value to variable B, and then assign a value to variable D. SAT solver 14 may then, without assigning values to the remaining variables, determine whether the partially enumerated solution violates one or more clauses of the SAT problem. Reference to a solution may encompass an enumerated solution, an unenumerated solution, or both, where appropriate. Reference to an enumerated solution may encompass a fully enumerated solution, a partially enumerated solution, or both, where appropriate.

If SAT solver 14 determines that the partially enumerated solution satisfies all the clauses of the SAT problem, SAT solver 14 may assign a value to variable E, then assign a value to variable I, then assign a value to a variable F, then assign a value to variable H, then assign a value to variable G. SAT solver 14 may then determine whether the fully enumerated solution violates one or more clauses of the SAT problem. If, on the other hand, SAT solver 14 determines that the partially enumerated solution violates one or more of the clauses of the SAT problem 14, SAT solver 14 may abandon the partially enumerated solution and not assign values to the remaining variables. Because all solutions that include the partially enumerated solution also necessarily violate at least the same clauses as the partially enumerated solution, SAT solver 14 may abandon all solutions that include the partially enumerated solution. SAT solver 14 may do so without individually enumerating each such solution and determining whether the solution satisfies all the clauses of the SAT problem, which may reduce one or more time requirements associated with searching for a valid solution to the SAT problem.

SAT solver 14 may use a conflict analysis technique to analyze one or more conflicts between a solution and one or more clauses of an SAT problem. According to such a technique, SAT solver 14 may analyze a conflict between a solution and the clauses of the SAT problem and, from the analysis, generate one or more additional clauses for determining whether solutions to the SAT problem are valid. SAT solver 14 may store the additional clauses in SAT data 16 and use the additional clauses (along with the original clauses of the SAT problem) to identify conflicts. The additional clauses may enable SAT solver 14 to more efficiently search for a valid solution to the SAT problem. As an example and not by way of limitation, the additional clauses may reduce a number of calculations needed to determine whether a solution is valid, which may enable SAT solver 14 to more efficiently determine whether the solution is valid.

First-order metrics engine 18 may collect first-order statistics on a search for a solution to an SAT problem. In particular embodiments, a first-order statistic on a search is a more or less directly observable statistic on the search. Examples of first-order statistics include, but are not limited to, the following: (1) number of conflicts since an event; (2) number of decisions since the event; and (3) lapsed time since the event. Reference to an event may encompass a start, a restart, a variable ordering, a variable reordering, or a combination of two or more of these, where appropriate. In particular embodiments, starting may include starting a search for a valid solution to an SAT problem. In particular embodiments, restarting may include abandoning a first search tree for searching for a valid solution to an SAT problem and generating a second search tree for searching for a valid solution to the SAT problem. SAT solver 14 may continue the search for a valid solution to the SAT problem using the second search tree. In the restarted search, SAT solver 14 may use one or more clauses that SAT solver 14 generated from one or more conflict analyses before the restart and stored in SAT data 16. In particular embodiments, ordering variables may include determining a variable order for enumerating solutions to an SAT problem. In particular embodiments, reordering variables may include abandoning a first variable order for enumerating solutions to an SAT problem and determining a second variable order for enumerating solutions to the SAT problem. A number of conflicts since an event may indicate how may conflicts SAT solver 14 has identified since the event. As an example and not by way of limitation, SAT solver 14 may restart a search for a valid solution to an SAT problem. As SAT solver 14 enumerates solutions to the SAT problem in the restarted search, SAT solver 14 may identify conflicts between solutions and the clauses of the SAT problem. First-order metrics engine 18 may collect a statistic indicating how many of conflicts SAT solver 14 has identified since the restart.

A number of decisions since an event may indicate how may decisions SAT solver 14 has made since the event. A decision may include an assignment of a value to a variable, a branching decision, or other decision. As an example and not by way of limitation, while SAT solver 14 is searching for a valid solution to an SAT problem, SAT solver 14 may abandon a first variable order for enumerating solutions to an SAT problem and determine a second variable order for enumerating solutions to the SAT problem. SAT solver 14 may then enumerate solutions to the SAT problem according to the second variable order. As SAT solver 14 enumerates solutions according to the second variable order, first-order metrics engine 18 may collect a statistic indicating how many values SAT solver 14 has assigned since the variable reordering. Lapsed time since an event may indicate how much time has lapsed since the event. As an example and not by way of limitation, SAT solver 14 may restart a search for a valid solution to an SAT problem. As SAT solver 14 carries out the restarted search, first-order metrics engine 18 may collect a statistic indicating how much time has lapsed since the restart.

Second-order metrics engine 20 may, from one or more first-order statistics, derive one or more second-order statistics on a search for a solution to an SAT problem. A second-order statistic may be a statistic that is derivable from one or more first-order statistics. As an example and not by way of limitation, a second-order statistic may include a conflict-to-decision ratio (CDR). Although a particular second-order statistic is described, the present invention contemplates any suitable second-order statistic. In particular embodiments, a CDR is equal to a first number of conflicts since an event divided by a second number of decisions since the event. As an example and not by way of limitation, if SAT solver 14 has, at a certain point in a restarted search for a valid solution to an SAT problem, identified seventy-five conflicts since the restart and made two hundred fifty-five decisions since the restart, a CDR of the restarted search at that point in the restarted search is approximately 0.294. As described below, SAT solver 14 may determine whether to restart a search for a valid solution to an SAT problem according to one or more CDRs. In addition or as an alternative, SAT solver 14 may determine whether to reorder variables for enumerating solutions to the SAT problem according to one or more CDRs.

Restart engine 22 may, according to one or more criteria, restart a search for a solution to an SAT problem. In particular embodiments, restart engine 22 may restart a search according to one or more CDRs. As an example and not by way of limitation, during a first search for a valid solution to an SAT problem, first-order metrics engine 18 may collect first-order statistics on the first search indicating number of conflicts and number of decisions since a start of the first search. As first-order metrics engine 18 collects these statistics, second-order metrics engine 20 may derive, on an on-going basis, a CDR from the number conflicts and the number of decisions, as described above. The CDR may change during the first search as SAT solver 14 identifies conflicts and makes decisions. Restart engine 22 may monitor the CDR and, if the CDR reaches a certain value, cause SAT solver 14 to abandon the first search and start a second search for a valid solution to the SAT problem. Accordingly, in particular embodiments, SAT solver 14 may schedule restarts according to the following algorithm:

```
//numConflicts refers to the number of conflicts
//that have occurred until now. numConflictsLast
//refers to the number of conflicts that had
//occurred until the time when dynamic restart was last
//invoked. numDecisions refers to the number of
//decisions made so far. numDecisionsLast refers
//to the number of decisions made until the time when
//dynamic restart was last invoked. If conflictInLastDecision
//is true, it indicates that a conflict was detected
//after the last branching decision was made.
EvalRestart ( ) {
   numConflictsSince = numConflicts − numConflictsLast;
   numDecisionsSince = numDecisions − numDecisionsLast;
   CDRR = numConflictsSince/numDecisionsSince;
   if(numConflictsSince >= 2000 &&
      numDecisionsSince >= 3000 &&
      CDRR < 0.5 &&
      conflictInLastDecision) {
      numConflictsLast = numConflicts;
      numDecisionsLast = numDecisions;
      dynamicRestart( );
   }
}
```

Ordering engine 24 may determine a variable order for enumerating solutions to an SAT problem. In addition, ordering engine 24 may, according to one or more criteria, abandon a first variable order for enumerating solutions to an SAT problem and determine a second variable order for enumerating solutions to the SAT problem. In particular embodiments, ordering engine 24 may reorder variables for enumerating solutions to an SAT problem according to one or more CDRs. As an example and not by way of limitation, during a search for a valid solution to an SAT problem, ordering engine 24 may determine a first variable order for enumerating solutions to the SAT problem. As SAT solver 14 enumerates solutions to the SAT problem according to the first variable order and determines whether the solutions are valid, first-order metrics engine 18 may collect first-order statistics on the search indicating number of conflicts and number of decisions since the variable ordering. As first-order metrics engine 18 collects these statistics, second-order metrics engine 20 may derive, on an on-going basis, a CDR from the number conflicts and the number of decisions, as described above. The CDR may change during the first search as SAT solver 14 identifies conflicts and makes decisions. Ordering engine 24 may monitor the CDR and, if the CDR reaches a certain value, abandon the first variable order and determine a second variable order for enumerating solutions to the SAT problem. Accordingly, in particular embodiments, SAT solver 14 may schedule variable reorderings according to the following algorithm:

```
//numConflicts refers to the total number of conflicts
//that have occurred until now. numConflictsLast
//refers to the number of conflicts that had
//occurred until the time when variable ordering was
//last updated. numDecisions refers to the number of
//decisions made so far. numDecisionsLast refers
//to the number of decisions made until the time when
//variable ordering was last updated.
EvalVarOrder( ) {
   numConflictsSince = numConflicts − numConflictsLast;
   if(numConflictsSince >= 75) {
      numDecisionsSince = numDecisions − numDecisionsLast;
      CDRV = numConflictsSince/numDecisionsSince;
      if(CDRV < 1.5) { //Search is expensive
         numConflictsLast = numConflicts;
         numDecisionsLast = numDecisions;
         update VariableOrder( );
      }
   }
}
```

Figure 2:
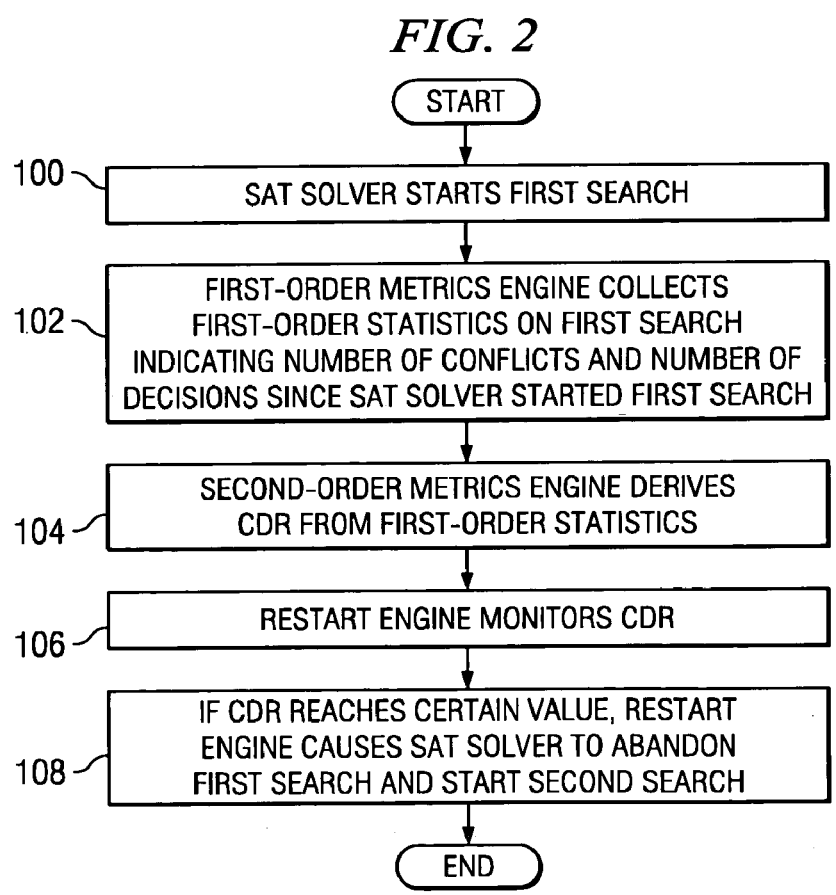
FIG. 2 illustrates an example method for scheduling events in an SAT solver.

FIG. 2 illustrates an example method for scheduling events in SAT solver 14. At step 100, SAT solver 14 starts a first search for a valid solution to an SAT problem. At step 102, as SAT solver 14 executes the first search, first-order metrics engine 18 collects first-order statistics on the first search that indicate number of conflicts and number of decisions since SAT solver 14 started the first search. At step 104, second-order metrics engine 20 derives a CDR from these first-order statistics. At step 106, restart engine 22 monitors the CDR. At step 108, if the CDR reaches a certain value, restart engine 22 causes SAT solver 14 to abandon the first search and start a second search for a valid solution to the SAT problem, at which point the method ends. The certain value may be a predetermined value and may correspond to an unacceptable level of inefficiency in a search for a valid solution to an SAT problem. The method illustrated in FIG. 2 may be repeated as SAT solver 14 searches for a valid solution to the SAT problem. Although particular steps of the method illustrated in FIG. 2 are illustrated and described as occurring in a particular order, the present invention contemplates any suitable steps of the method illustrated in FIG. 2 occurring in any suitable order.

FIG. 3 illustrates another example method for scheduling events in SAT solver 14. At step 200, during a search for a valid solution to an SAT problem, ordering engine 24 determines a first variable order for enumerating solutions to the SAT problem. At step 202, SAT solver 14 enumerates solutions to the SAT problem according to the first variable order and determines whether the solutions are valid. At step 204, as SAT solver 14 enumerates solutions to the SAT problem and determines whether the solutions are valid, first-order metrics engine 18 collects first-order statistics on the search indicating number of conflicts and number of decisions since the variable ordering. At step 206, second-order metrics engine 20 derives a CDR from these first-order statistics. At step 208, ordering engine 24 monitors the CDR. At step 210, if the CDR reaches a certain value, ordering engine 24 abandons the first variable order and determines a second variable order for enumerating solutions to the SAT problem. The certain value may be a predetermined value and may correspond to an unacceptable level of inefficiency in a search for a valid solution to an SAT problem. At step 212, SAT solver 14 enumerates solutions according to the second variable order, at which point the method ends. The method illustrated in FIG. 3 may be repeated as SAT solver 14 searches for a valid solution to the SAT problem. Although particular steps of the method illustrated in FIG. 3 are illustrated and described as occurring in a particular order, the present invention contemplates any suitable steps of the method illustrated in FIG. 3 occurring in any suitable order.

Although the present invention has been described with several embodiments, myriad changes, variations, alterations, transformations, and modifications may be suggested to one skilled in the art, and it is intended that the present invention encompass such changes, variations, alterations, transformations, and modifications as fall within the scope of the appended claims. The present invention is not intended to be limited, in any way, by any statement in the specification that is not reflected in the claims.

What is claimed is:

1. A system for scheduling events in a Boolean satisfiability (SAT) solver, the system comprising:
    a first engine operable to collect one or more first-order statistics on a search for a valid solution to an SAT problem;
    a second engine operable to derive one or more second-order statistics on the search from the one or more first-order statistics, wherein at least one of the second-order statistics is a conflict-to-decision ratio (CDR); and
    a third engine operable to schedule events in the search according to one or more of the second-order statistics.

2. The system of claim 1, wherein the events are restarts.

3. The system of claim 1, wherein the events are variable reorderings.

4. The system claim 1, wherein a first one of the first-order statistics indicates a first number of conflicts since a particular event and a second one of the first-order statistics indicates a second number of decisions since the particular event.

5. The system of claim 4, wherein the particular event is a start or a last restart.

6. The system of claim 4, wherein the particular event is a variable ordering or a last variable reordering.

7. The system of claim 1, wherein the search for a valid solution to the SAT problem is associated with electronic design automation (EDA).

8. A method for scheduling events in a Boolean satisfiability (SAT) solver, the method comprising:
    collecting one or more first-order statistics on a search for a valid solution to an SAT problem;
    deriving one or more second-order statistics on the search from the one or more first-order statistics, wherein at least one of the second-order statistics is a conflict-to-decision ratio (CDR); and
    scheduling events in the search according to one or more of the second-order statistics.

9. The method of claim 8, wherein the events are restarts.

10. The method of claim 8, wherein the events are variable reorderings.

11. The method of claim 8, wherein a first one of the first-order statistics indicates a first number of conflicts since a particular event and a second one of the first-order statistics indicates a second number of decisions since the particular event.

12. The method of claim 11, wherein the particular event is a start or a last restart.

13. The method of claim 11, wherein the particular event is a variable ordering or a last variable reordering.

14. The method of claim 8, wherein the search for a valid solution to the SAT problem is associated with electronic design automation (EDA).

15. Logic for scheduling events in a Boolean satisfiability (SAT) solver, the logic encoded in media and when executed operable to:
    collect one or more first-order statistics on a search for a valid solution to an SAT problem;
    derive one or more second-order statistics on the search from the one or more first-order statistics, wherein at least one of the second-order statistics is a conflict-to-decision ratio (CDR); and
    schedule events in the search according to one or more of the second-order statistics.

16. The logic of claim 15, wherein the events are restarts.

17. The logic of claim 15, wherein the events are variable reorderings.

18. The logic of claim 15, wherein a first one of the first-order statistics indicates a first number of conflicts since a particular event and a second one of the first-order statistics indicates a second number of decisions since the particular event.

19. The logic of claim 18, wherein the particular event is a start or a last restart.

20. The logic of claim 18, wherein the particular event is a variable ordering or a last variable reordering.

21. The logic of claim 15, wherein the search for a valid solution to the SAT problem is associated with electronic design automation (EDA).

22. A system for scheduling events in a Boolean satisfiability (SAT) solver, the system comprising:
    means for collecting one or more first-order statistics on a search for a valid solution to an SAT problem;
    means for deriving one or more second-order statistics on the search from the one or more first-order statistics, wherein at least one of the second-order statistics is a conflict-to-decision ratio (CDR); and
    means for scheduling events in the search according to one or more of the second-order statistics.

* * * * *

UNITED STATES PATENT AND TRADEMARK OFFICE
CERTIFICATE OF CORRECTION

PATENT NO. : 7,194,710 B2 Page 1 of 1
APPLICATION NO. : 10/807959
DATED : March 20, 2007
INVENTOR(S) : Mukul R. Prasad et al.

It is certified that error appears in the above-identified patent and that said Letters Patent is hereby corrected as shown below:

Column 6, Line 37, delete "EvaIVarOrder" and insert -- EvalVarOrder --.

Signed and Sealed this

Twenty-first Day of October, 2008

JON W. DUDAS
*Director of the United States Patent and Trademark Office*